United States Patent
Hu et al.

(10) Patent No.: US 6,515,545 B1
(45) Date of Patent: Feb. 4, 2003

(54) RF POWER AMPLIFIER TRANSISTOR QUIESCENT CURRENT CHECKING AND ADJUSTING

(75) Inventors: Zhiqun Hu, Middletown, OH (US); Dmitriy Borodulin, Mason, OH (US); George Cabrera, Mason, OH (US); Timothy Dittmer, Mason, OH (US); Gavin Monson, Oxford, OH (US); Paul Moore, Cincinnati, OH (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/932,422

(22) Filed: Aug. 17, 2001

(51) Int. Cl.[7] .................................................. H03F 3/68
(52) U.S. Cl. ...................... 330/295; 330/51; 330/124 R
(58) Field of Search ............................... 330/51, 124 R, 330/295

(56) References Cited

U.S. PATENT DOCUMENTS 6,137,355 A * 10/2000 Sevic et al. .................... 330/51
6,188,277 B1   2/2001 Borodulin et al. ............ 330/51
6,359,504 B1 *  3/2002 Cozzarelli ................ 330/124 R

FOREIGN PATENT DOCUMENTS

JP          58213517      * 12/1983

OTHER PUBLICATIONS

Callewaert et al. Class AB CMOS amplifiers with high efficiency Solid–State Circuits IEEE Journal of, vol. 25, Issue 3, Jun. 1990 pp. 684–691.*

* cited by examiner

Primary Examiner—Michael B Shingleton
(74) Attorney, Agent, or Firm—Tarolli, Sundheim, Covell, Tummino & Szabo L.L.P.

(57) ABSTRACT

A power amplifier system is presented for use in amplifying an RF input signal comprising N sub-power amplifiers are connected together in parallel with each receiving and amplifying a portion of the RF input signal. A combiner combines the amplified portions of the RF input signal to provide a combined output signal. Each sub-amplifier includes at least one transistor having an input port that receives a DC bias voltage and an output port, such that when the RF input signal is not present a quiescent current flows through the output port. A controller is operative when the RF signal is not present to check and adjust the magnitude of the quiescent current flowing in each of the sub-amplifier output ports in the sequence of 1 . . . N.

12 Claims, 5 Drawing Sheets

RF POWER AMPLIFIER TRANSISTOR QUIESCENT CURRENT CHECKING AND ADJUSTING

TECHNICAL FIELD

The present invention is generally directed to an RF power amplifier system for use in amplifying an RF input signal and is more particularly directed toward checking and adjusting the value of quiescent currents flowing through transistors employed in the system.

BACKGROUND OF THE INVENTION

RF power amplifier systems are known in the art for use in amplifying RF signals for broadcasting purposes, including radio and television. Such a power amplifier system is disclosed in our U.S. Pat. No. 6,188,277 assigned to the same Assignee as the present application. This patent is hereby incorporated herein by reference. Such a power amplifier system employs a plurality of sub-amplifiers operating together in parallel with each receiving and amplifying a portion of an RF input signal. The amplified portions are then combined to provide a combined output signal. Each sub-amplifier includes at least one transistor having an input port that receives a DC bias voltage and an output port. When the RF input signal is not present, a quiescent current flows through the output port. The transistors may take the form of MOSFET transistors.

All LDMOS transistors have a characteristic called bias or $I_{dq}$ drift. Early versions of these devices had significant drift, which created a problem for designers. Some improvements in device design and processing have resulted in lower drift parts becoming available. Unfortunately, drift has not gone away completely. All CMOS devices are susceptible to degradation of performance caused by a phenomenon known as hot carrier injection. This is a consequence of the combination of the oxide layer used to insulate the active elements in these devices in combination with the strong electric fields resulting from small device geometries. Hot carrier injections occurs when electrons with higher than average energy (the "hot" electrons) are accelerated into the dielectric layer (the injection) resulting in microscopic damage to the oxide layer. The "traps" created by this damage collect charge over time.

MOSFET transistors are CMOS devices designed for high frequency, high voltage operation, and all parts exhibit the hot carrier injection effect to some degree. Hot carrier injection results in charge build-up in the gate-drain region, which causes the gate field to change. The user sees this as a change in the quiescent current ($I_{dq}$) with a fixed gate voltage. The projected drift of $I_{dq}$ is usually from 10 to 25% over 20 years of the device life span. $I_{dq}$ drift affects the level of distortion for the RF signal generated by the device. According to device manufacturer's data there is an optimum level of $I_{dq}$ that allows minimum amount of distortions. Deviation from it in either direction will degrade the intermodulation (IMD) performance of the device. Initially aligned for optimum performance the device will eventually de-tune and will require additional alignment.

The most common solution is a short burn-in of the device in a circuit prior to final alignment of the current. As a consequence of the logarithmic time relationship, approximately 50% of the $I_{dq}$ drift that will occur in a projected 20-year operating lifetime occurs in the first 24 to 36 hours of operation. A relatively short burn-in, especially if the drift is accelerated, will reduce the bias drift during the equipment operating life. Acceleration is accomplished by operating the device at an elevated $V_{ds}$ without RF drive. Burn-in process increases the final cost of the product without completing the task. The $I_{dq}$ is still going to change, however at a much slower rate.

The temperature of a power amplifier affects the magnitude of the quiescent current. The magnitude of this quiescent or bias current changes over a period of time as the device ages. At this time, it is not practical to adjust the quiescent current once the product is in the field for the reasons as discussed above. Preferably, a controller should be provided that automatically checks and adjusts the magnitude of the quiescent current flowing in each of the transistors. This is provided by the invention herein.

SUMMARY OF THE INVENTION

In accordance with one aspect of the present invention, a power amplifier system is provided for use in amplifying an RF input signal. The system includes N sub-power amplifiers connected together in parallel with each receiving and amplifying a portion of the RF input signal. A combiner combines the amplified portions of the RF input signal and provides a combined output signal. Each sub-amplifier includes at least one transistor having an input port that receives a DC bias voltage and an output port, such that when the RF input signal is not present, a quiescent current flows through the output port. A controller is operative, when the RF signal is not present, to check and adjust the magnitude of the quiescent current flowing in each of said sub-amplifier output ports in the sequence of 1 . . . N.

BRIEF DESCRIPTION OF THE DRAWINGS

The foregoing and other advantages of the invention will become more readily apparent from the following description of the preferred embodiment of the invention as taken in conjunction with the accompanying drawings, which are a part hereof, and wherein.

DESCRIPTION OF A PREFERRED EMBODIMENT

Figure 1:
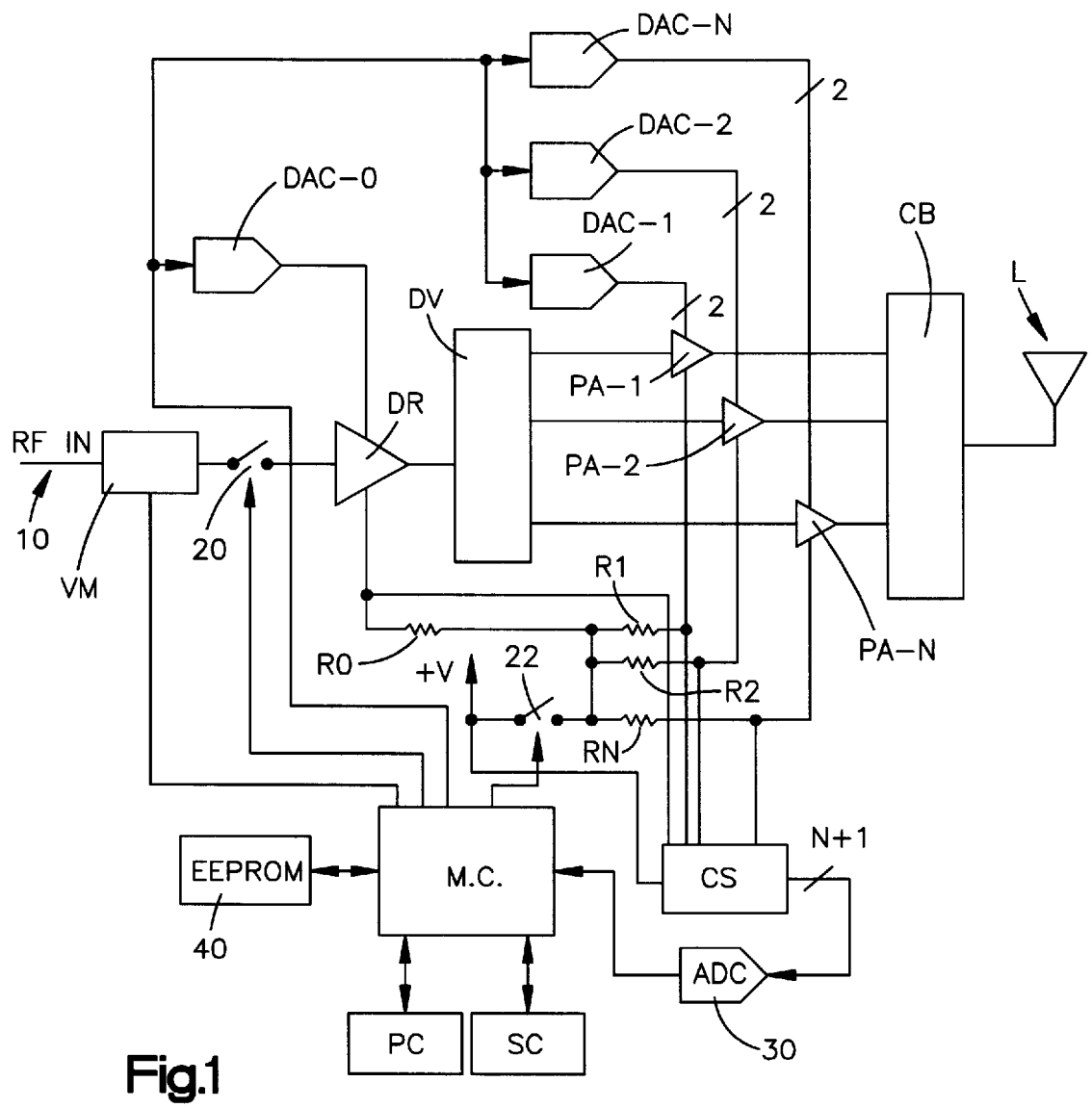
FIG. 1 is a schematic-block diagram illustration of apparatus employed in one embodiment of the invention.

Reference is now made to FIG. 1 which illustrates a power amplifier system that receives a RF input signal at an input 10 and amplifies the signal and supplies it to a load L, which may take the form of a transmitting antenna and associated equipment. As an example only, the RF input signal may have a magnitude on the order of 20 milliwatts and have a frequency within a frequency range from 470 MHz to 860 MHz with a 6 MHz bandwidth for the television channel involved. The signal may be increased by the amplifier so that the output signal is applied to the load L maybe on the order of 1 kW or more.

The RF input signal is applied to an input 10 and, thence, to a vector modulator VM. The modulator changes the magnitude and the phase of the RF signal under the control of a microcontroller M.C. The modified RF signal is then amplified by a driver DR to a higher level, such as 20 watts. The output, as taken from the driver DR, is then supplied to a power divider DV, sometimes referred to as a signal or power splitter, which divides the amplified signal into a plurality of signal portions. These signal portions are then respectively applied to a plurality of sub-power amplifiers PA-1 through PA-N, where N for example, may be eleven. The signals from the sub-power amplifiers PA-1 through PA-N are then combined in a signal combiner CB to provide a combined output signal which is applied to the load L. The modulated input signal is supplied to the driver when switch 20 is closed. This switch is controlled by the microcontroller MC, as will be discussed in greater detail hereinafter.

Each of the sub-power amplifiers PA-1 through PA-N includes at least one transistor, such as a MOSFET. The drain-source circuit of each transistor is connected in series with one of the resistors $R_1$ through $R_N$ to a current sensor network CS which, as will be described hereinafter, is employed for measuring the current flowing in the drain-source circuit when the RF signal is muted, as by opening switch 20. During this checking period, the magnitude of this current, hereinafter referred to as the quiescent current $I_{dq}$, is measured. This is done by the voltage developed at one of the resistors $R_1$–$R_N$ when switch 22 is closed. This places the +V voltage in series with the resistor associated with the sub-power amplifier being checked and is measured by the current sensor CS operating in a known manner. The value of the measured quiescent current is then converted from an analog to a digital signal with an analog to digital converter 30 and supplied to the microcontroller MC. In addition to the N sub-power amplifiers, the current is also measured for the driver DR with resistor $R_0$. The microcontroller MC, as will be described in greater detail hereinafter, is programmed to operate when the RF signal is muted to check and adjust the magnitude of the quiescent current. The magnitude of the quiescent current in each of the sub-power amplifiers is adjusted by varying the bias voltage and this is obtained by the microcontroller supplying suitable data to an associated digital to analog converter DAC-1 through DAC-N. This may also be accomplished for the driver DR by supplying suitable data to a digital analog converter DAC-0 that supplies bias voltage to driver DR.

The value of the target quiescent current for each transistor may be stored in a non-volatile memory, such as an EEPROM memory 40. This memory is in communication with the microcontroller MC. The quiescent current setup for all of the amplifiers may be done automatically by supplying a quiescent current adjustment command to the microcontroller from a personal computer PC or a system controller SC.

Figure 2:
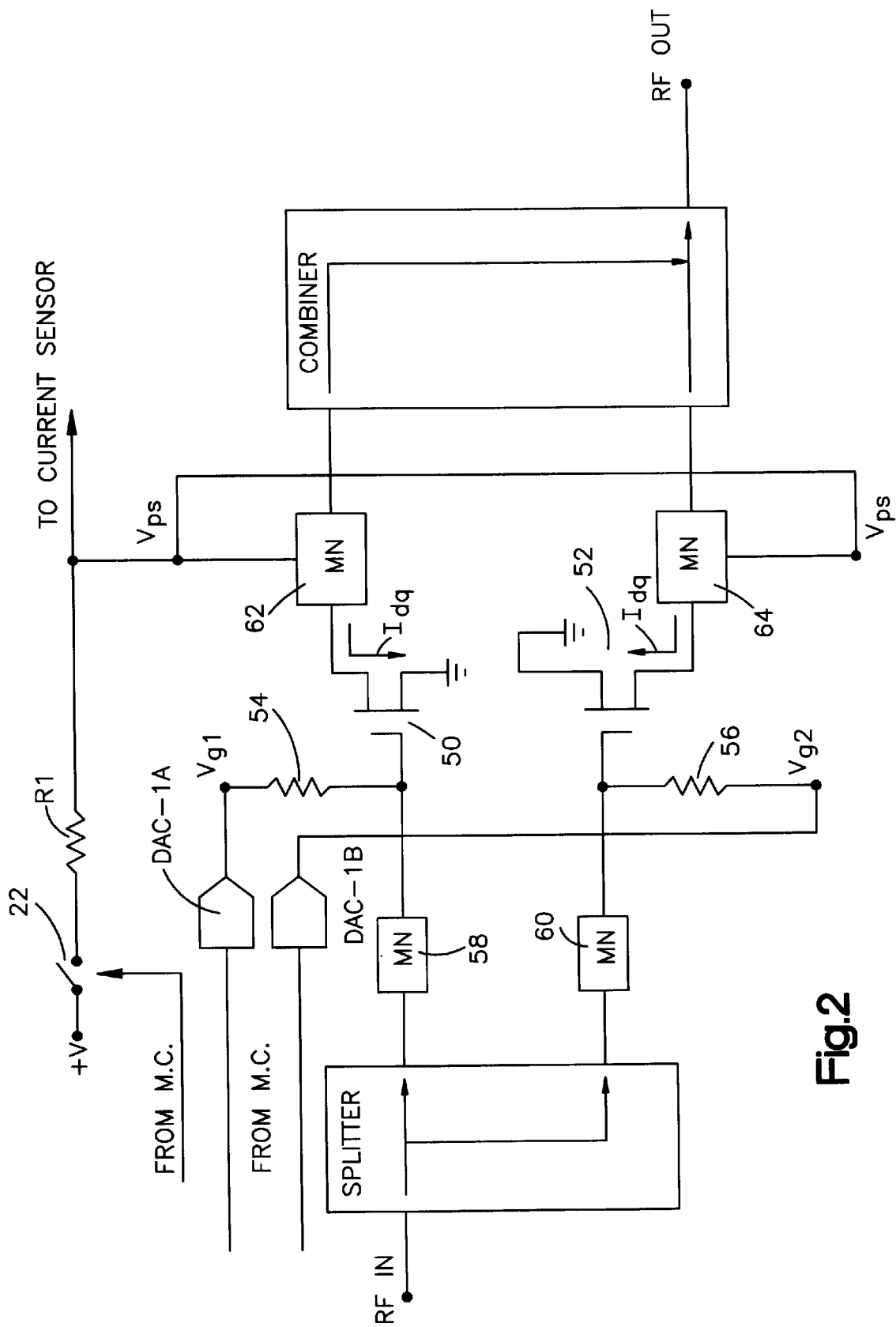
FIG. 2 is a schematic diagram illustrating a simplified example of the type of circuitry employed in each sub-power amplifier.

To facilitate an understanding of the invention as it applies to checking and adjusting quiescent current, reference is now made to FIG. 2. This figure provides a simplified version of the type of circuit employed in a sub-power amplifier and suffices for the purposes of explaining the quiescent current issue. This amplifier includes a pair of MOSFET transistors 50 and 52. These transistors are considered as being in the same sub-amplifier or same pallet. However they are in different groups with transistor 50 being considered in group A and transistor 52 in group B. The magnitude of the bias voltage supplied between ground and the gate electrode of each transistor is obtained from a digital to analog converter DAC-1A or DAC-1B under control of the microcomputer MC. The bias voltage for transistor 50 is supplied through resistor 54 and that for transistor 52 is supplied through resistor 56. Impedance matching networks 58, 60, 62 and 64 are connected as shown. When the RF input signal is not present (or muted) quiescent current $I_{dq}$ will flow through the drain to source electrodes of these transistors from the power supply so long as switch 22 (see FIG. 1) is closed by the microcontroller.

In accordance with the present invention, the magnitude of the quiescent current flowing in the transistors is periodically checked and adjusted as needed when the RF input signal is not present. The quiescent current flowing in transistor 50 is checked at a different time than that for transistor 52. If an adjustment needs to be made to the quiescent current then the microcontroller MC will adjust the DC bias voltage supplied to the input port or gate of the transistor. All of the transistors in group A of all of the sub-amplifiers 1-N will be sequentially checked and adjusted in the sequence 1-N for a maximum number of iterations $K_{max}$. Thereafter, all of the transistors in the other group of the sub-amplifiers will be sequentially checked and adjusted.

Reference is now made to FIGS. 3–7 that illustrate the manner in which the microcontroller MC is programmed to accomplished the functions herein.

Figure 3:
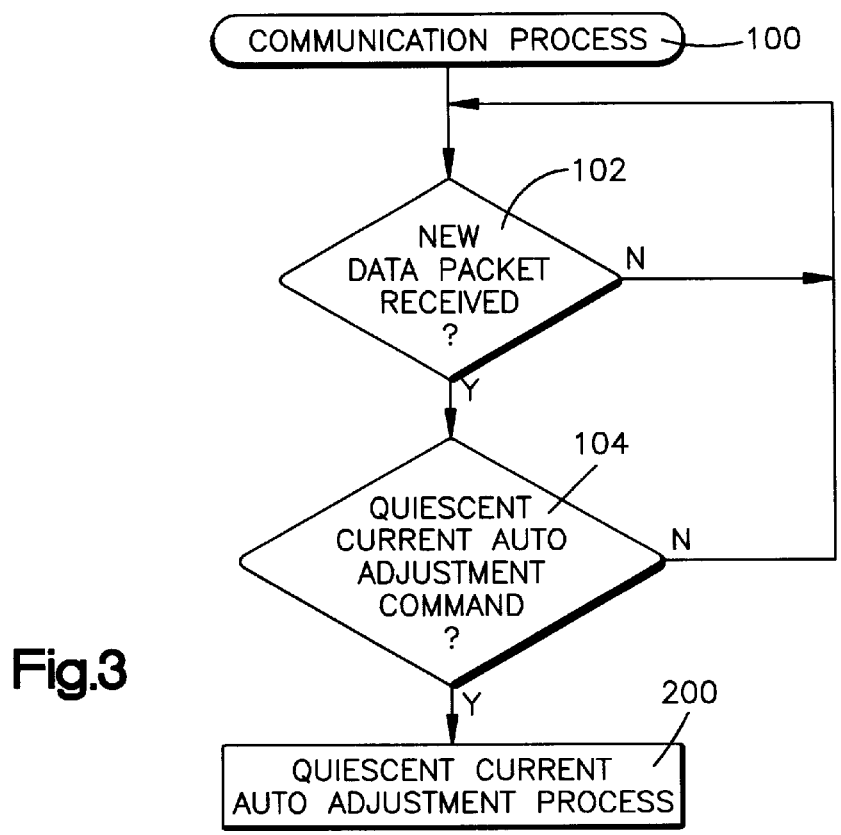
FIG. 3 is a flow diagram of one routine involved in the invention.
Figure 4:
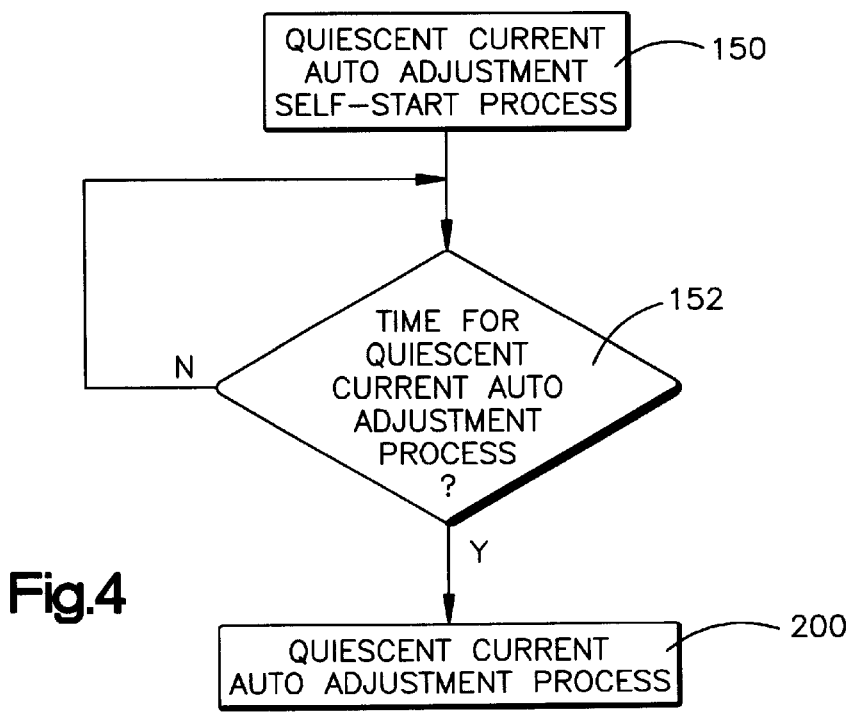
FIG. 4 is a flow diagram of another routine involved in the invention.

The communication process 100 is illustrated in FIG. 3. The process advances to step 102 during which a determination is made as to whether a new data packet has been received such as from the system controller SC or the personal computer PC. If not, then the procedure repeats itself until a data packet has been received. If a data packet has been received, the procedure advances to step 104.

In step 104 a determination is made as to whether the data packet includes a quiescent current auto-adjustment command. If not, the procedure returns to await a new data packet. If the data packet does contain a quiescent current auto-adjustment command, then the procedure advances to step 200 which is the quiescent current auto-adjustment process and this is described in detail with reference to FIG. 5.

As an alternative to the communication process 100, there is another process 150 which is the quiescent current auto-adjustment self-start process. This process will result in advancement to the quiescent current auto-adjustment process 200 without receiving an auto-adjustment command from communication externally. Instead, a function embedded within the microcontroller includes a timer that times out a given period of time, such as six months, at which point it has been determined that the quiescent currents should be automatically adjusted. In this case, the procedure advances to step 152 during which a determination is made as to whether the timer has timed out calling for a quiescent current auto-adjustment process. If not, the procedure will wait for the time out happening. If the determination is yes, then the procedure advances to step 200 which is the quiescent current auto-adjustment process to be described with reference to FIG. 5.

Figure 5:
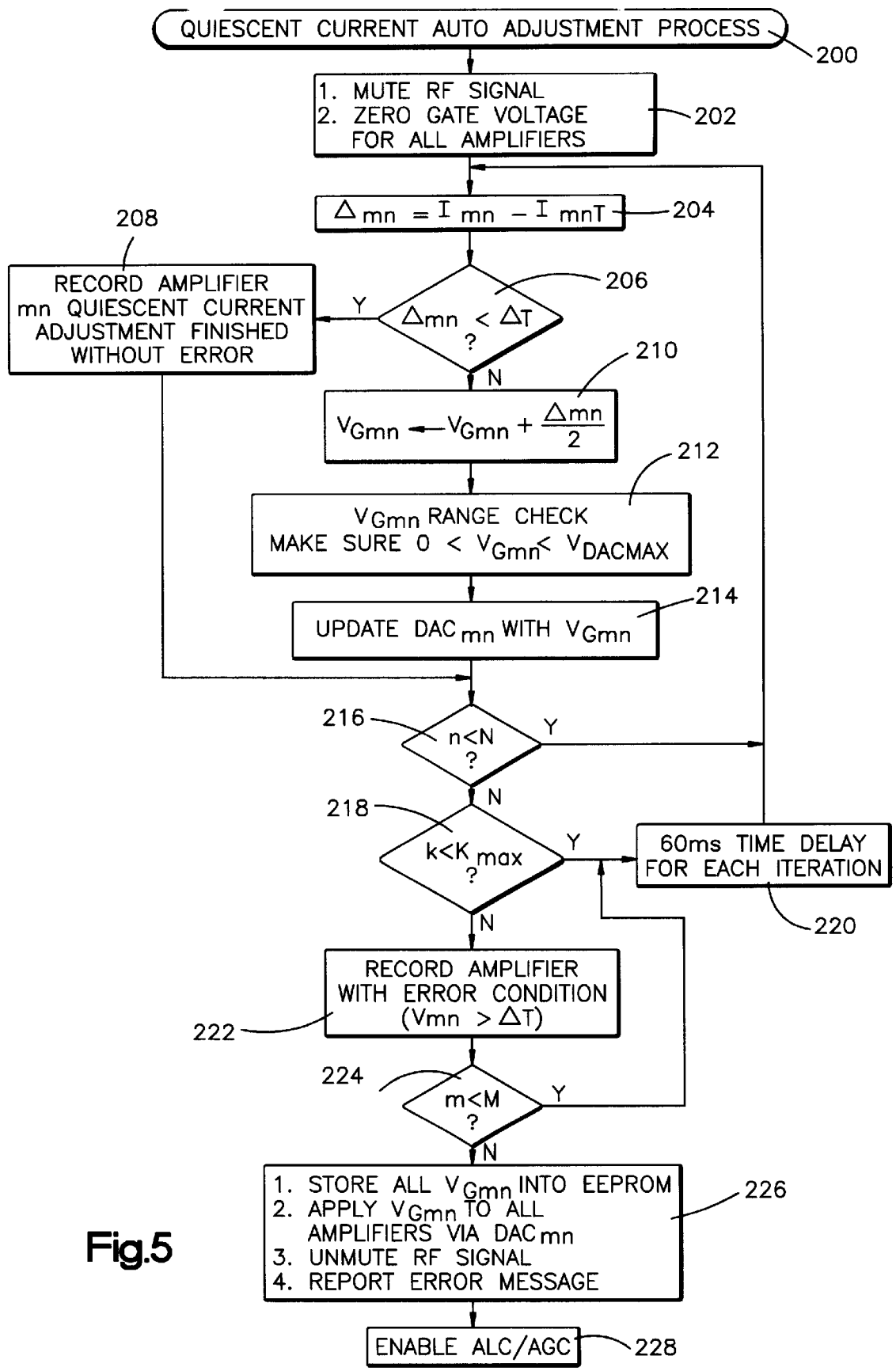
FIG. 5 is a flow diagram of another routine involved in the invention.

Reference is now made to FIG. 5 which illustrates the quiescent current auto-adjustment process 200. In this process the procedure advances to step 202 during which the microcontroller mutes the RF signal by opening switch 20 and provides zero gate voltage for all sub-amplifiers. During this step, the microcontroller also disables any automatic level control (ALC) or automatic gain control(AGC) operation that was being performed. The procedure advances to checking and adjusting the quiescent current in a sequence starting with the first sub-amplifier or pallet n. The first to be examined is that for the sub-amplifier PA-1. Also, only one side of each pallet is examined and that side is referred to as group m, where m is either the left side which has been referred to as group A or the right side which is referred to herein as group B. Consequently, the examination will be with reference to transistor mn with the first sub-power amplifier PA-1 being examined and being referred to as m=1 for the group A and n=1 for pallet number 1. With this in mind, reference should now be made to Table 1 which provides a definition of the terms being employed in the discussion that follows.

TABLE 1

| 1 | m: | Group number |
|---|---|---|
| 2 | n | Pallet number |
| 3 | M: | Number of groups |
| 4 | N: | Number of pallets |
| 5 | $I_{mn}$: | Quiescent current of the sub-amplifier at Group m and Pallet n |
| 6 | $I_{mnT}$: | Specified target quiescent current of the sub-amplifier at Group m and Pallet n |
| 7 | $V_{Gmn}$: | The gate voltage of the sub-amplifier in Group m and Pallet n |
| 8 | K: | Iteration number |
| 9 | $K_{MAX}$: | Maximum allowed iteration number |
| 10 | $\Delta_{mn}$: | The difference of the quiescent current and the target quiescent current of the sub-amplifier at Group m and Pallet n |
| 11 | $\Delta_T$: | Error tolerance between the quiescent current and the target quiescent current of the sub-amplifier, which is determined by ADC/DAC precision and the current sensor accuracy |
| 12 | $V_{DACMAX}$: | Full scale DAC output voltage |
| 13 | $DAC_{mn}$: | DAC channel for Group m and Pallet n |

Continuing with the description of the quiescent current auto-adjustment process 200, the procedure advances from step 202 to step 204. During this step, the microcontroller obtains from memory 40 the value of $I_{mnT}$. This is the target value of the quiescent current of the sub-amplifier at group m and pallet n. During this step, the microcontroller also obtains the value of the current $I_{mn}$ which is obtained from the current sensor CS employed for measuring the current at the selected amplifier at group m and pallet n. Also during this step, the microcontroller obtains the value of the difference $\Delta_{mn}$. This is the difference of the value of the quiescent current and the value of the target quiescent current of the sub-amplifier being checked. The procedure then advances to step 206.

In step 206, a determination is made as to whether the difference $\Delta_{mn}$ is less than the value of an error tolerance $\Delta_T$. The error tolerance is the allowable difference that may exist between the value of the quiescent current and the value of the target quiescent current. If the measure difference $\Delta_{mn}$ is less than the error tolerance $\Delta_T$ then no adjustment is made to the bias current and the procedure advances to step 208 during which the microcontroller records in memory that this sub-amplifier did not require adjustment and no error has been determined.

If the determination at step 206 is negative, the microcontroller adjusts the bias voltage supplied to the sub-amplifier at mn as is noted in step 210. In this case, the gate voltage $V_{Gmn}$ for the sub-amplifier under examination is set to the value of $V_{Gmn}$ prior to making the measurement plus the value of $$\frac{\Delta_{mn}}{2}.$$

The procedure advances to step 212.

Step 212 involves a bias voltage $V_{Gmn}$ range check to make sure that the new bias voltage is within the range of operation by being greater than zero but less than the full scale DAC output voltage. The procedure advances to step 214.

In step 214, the new value of the bias voltage $V_{Gmn}$ is applied by the associated digital to analog converter DAC to the correct side of the sub-amplifier being examined. The procedure then advances to step 216.

In step 216, a determination is made as to whether the pallet number n is less than the number of pallets N. If not, the procedure advances to step 218. However, if the answer is yes, then that means more pallets must be examined during this iteration of examining one side of all of the pallets. The procedure returns to step 204 to examine the next pallet in the sequence.

In step 218, a determination is made as to whether the iteration K just completed (the sequential examination of n pallets) is less than the maxim allowed iteration number $K_{MAX}$ (such as 25). If the determination is yes, then the procedure advances to step 220 during which a 60 millisecond time delay takes place before starting the next iteration (sequential examination of pallets) and the procedure returns to step 204 to commence the sequential checking and adjustment of the pallets during the next iteration.

If the determination in step 218 is no, the procedure advances to step 222 during which a record is made at the microcontroller of the sub-amplifier with the error condition and the procedure advances to step 224. In step 224, a determination is made as to whether the group number m of the pallets of sub-amplifiers is less than the number of groups M. If the determination is yes, then this means that another group needs to be examined and the procedure advances to step 220 for a 60 millisecond time delay before commencing a new iteration for a different group than that which was just examined.

If the determination in step 224 is no, the procedure advances to step 226 during which the microcontroller stores all of the values for the gate voltages in the EEPROM, applies the proper gate voltages to all of the sub-amplifiers by way of the appropriate digital to analog converter $DAC_{mn}$, un-mutes the RF signal by closing switch 20 and reports error messages as required. The procedure then advances to step 228 which is the normal operation of the transmitter with the microcontroller providing its normal automatic level control or automatic gain control operations.

Figure 6:
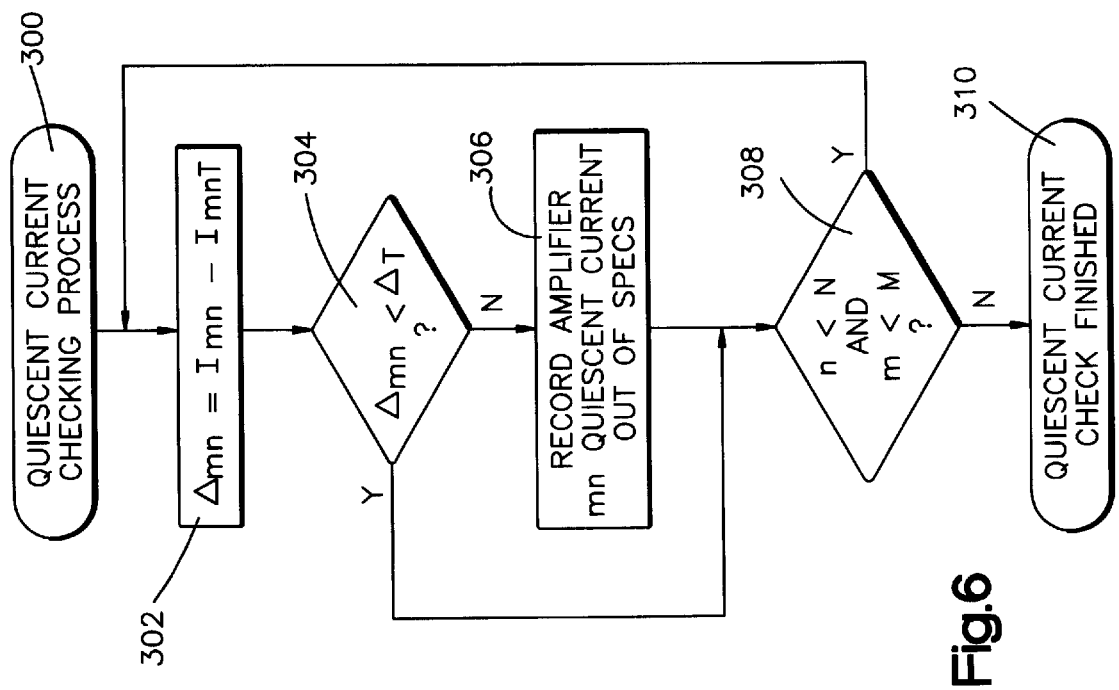
FIG. 6 is a flow diagram of another routine involved in the invention.

Reference is now made to FIG. 6 which illustrates the flow diagram for the quiescent current checking process 302. In step 302 the difference $\Delta_{mn}$ is obtained from $I_{mn} - I_{mnT}$ as in step 204 and the procedure advances to step 304. In step 304, a determination is made as to whether the difference $\Delta_{mn}$ is less than the error tolerance $\Delta_T$. If not, the procedure advances to step 306 during which the microcomputer records the sub-amplifier mn that has the quiescent current out of specification. The procedure advances to step 308.

In step 308, a determination is made as to whether n is less than N and whether m is less than M and if so, the procedure returns to step 302 and if not, the procedure advances to step 310 indicative that the quiescent current checking is finished.

Figure 7:
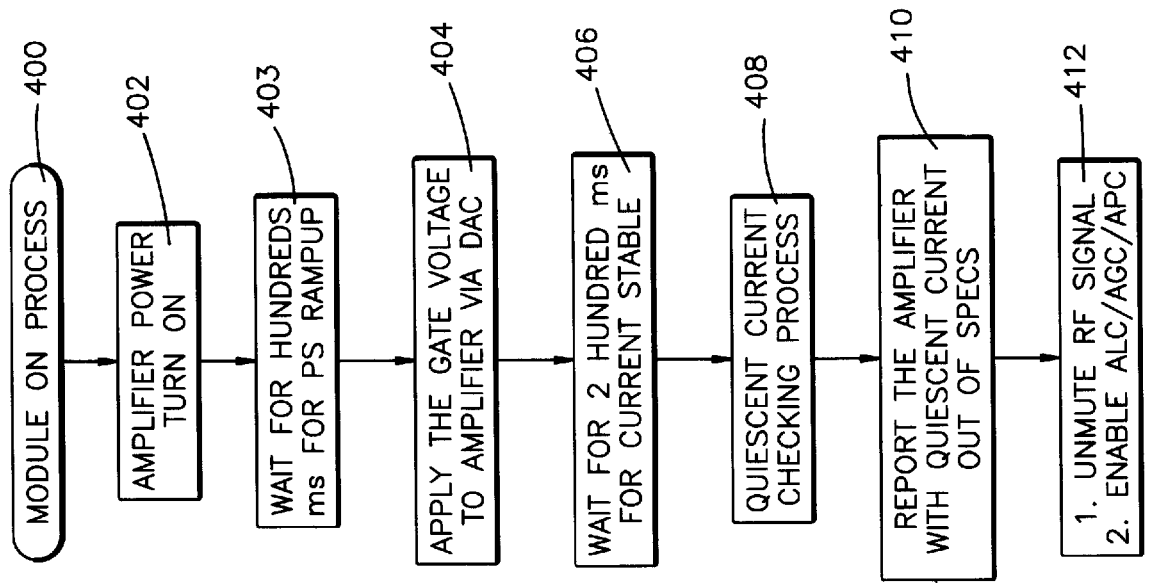
FIG. 7 is a flow diagram of another routine involved in the invention.

Reference is now made to FIG. 7 which illustrates the module on process 400. During this process the amplifier power is turned on at step 402 and the procedure advances to step 403 where there is a delay for the power supply to ramp up and the value of the bias or gate voltage is applied to the amplifier in step 404.

In step 406, a delay of 200 milliseconds is encountered while waiting for the current in the amplifier to stabilize. The procedure then advances to step 408 which is the quiescent checking process of step 300 in FIG. 6. The procedure then advances to step 410 during which the microcontroller reports that an amplifier has the quiescent current out of specification and the procedure advances to step 412 during which the RF signal is un-muted by closing switch 20 and returning to normal operation with automatic level control and gain control operation.

Although the invention has been described in conjunction with a preferred embodiment, it is to be appreciated that various modifications may be made without departing from the spirit and scope of the invention as defined by the appended claims.

Having described the invention, we claim:

1. A power amplifier system for use in amplifying an RF input signal comprising:

N sub-power amplifiers connected together in parallel with each receiving and amplifying a portion of said RF input signal;

a combiner that combines said amplified portions of said RF input signal to provide a combined output signal;

each said sub-amplifier including at least one transistor having an input port that receives a DC bias voltage and an output port, such that when said RF input signal is not present a quiescent current flows through said output port;

a controller operative when said RF signal is not present to check and adjust the magnitude of the quiescent current flowing in each of said sub-amplifier output ports in the sequence of 1 . . . N.

2. A power amplifier system as set forth in claim 1 wherein the quiescent current checking and adjusting of each said sub-amplifier in said sequence involves, for each sub-amplifier, determining whether the magnitude of the quiescent current in that sub-amplifier differs from a target value of the magnitude of the quiescent current for that sub-amplifier.

3. A power amplifier system as set forth in claim 1 wherein the target value of the quiescent current for each said sub-amplifier is stored in a memory.

4. A power amplifier system as set forth in claim 3 wherein said memory is a non-volatile memory.

5. A power amplifier system as set forth in claim 3 wherein said controller obtains the value of the target quiescent current for the sub-amplifier being checked from said memory prior to performing said checking and adjusting operation.

6. A power amplifier system as set forth in clam 5 wherein said controller obtains the difference between the values of said quiescent current and that of said target value.

7. A power amplifier system as set forth in claim 6 wherein said controller determines whether said difference is less than an error tolerance.

8. A power amplifier system as set forth in claim 7 wherein if said difference is not less than said error tolerance, then said controller records the value of the quiescent current for that sub-amplifier as being without error.

9. A power amplifier system as set forth in claim 8 wherein said controller obtains the value of said error tolerance from said memory.

10. A power amplifier system as set forth in claim 7 wherein if said difference is not less than said error tolerance, then the controller adjusts the value of said DC bias voltage for that sub-amplifier to a new value based on said difference.

11. A power amplifier system as set forth in claim 10 wherein the magnitude of said new value is the present value plus ½ of said difference.

12. A power amplifier system as set forth in claim 11 wherein said controller stores said new value in said memory.

* * * * *